US010084053B1

United States Patent
Xie et al.

(10) Patent No.: US 10,084,053 B1
(45) Date of Patent: Sep. 25, 2018

(54) GATE CUTS AFTER METAL GATE FORMATION

(71) Applicant: GLOBALFOUNDRIES Inc., Grand Cayman (KY)

(72) Inventors: Ruilong Xie, Schenectady, NY (US); Chanro Park, Clifton Park, NY (US); Min Gyu Sung, Latham, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/470,205

(22) Filed: Mar. 27, 2017

(51) Int. Cl.
*H01L 21/82* (2006.01)
*H01L 29/423* (2006.01)
*H01L 21/8234* (2006.01)
*H01L 21/28* (2006.01)
*H01L 29/417* (2006.01)

(52) U.S. Cl.
CPC .. *H01L 29/42368* (2013.01); *H01L 21/28176* (2013.01); *H01L 21/823462* (2013.01); *H01L 29/41775* (2013.01); *H01L 29/4238* (2013.01); *H01L 29/42328* (2013.01)

(58) Field of Classification Search
CPC ......... H01L 29/42368; H01L 21/28176; H01L 21/823462; H01L 29/41775; H01L 29/42328; H01L 29/4238
See application file for complete search history.

(56) References Cited

U.S. PATENT DOCUMENTS

| 9,064,932 B1 | 6/2015 | Pham et al. | |
| 2015/0303117 A1* | 10/2015 | Zhu | H01L 27/0629 438/238 |
| 2017/0005178 A1* | 1/2017 | Duriez | H01L 29/66522 |
| 2017/0229460 A1* | 8/2017 | Czornomaz | H01L 27/0922 |

* cited by examiner

*Primary Examiner* — Thien F Tran
(74) *Attorney, Agent, or Firm* — Thompson Hine LLP; Francois Pagette

(57) ABSTRACT

Structures involving a field-effect transistor and methods for forming a structure that involves a field-effect transistor. A first metal gate electrode and a second metal gate electrode are formed that are embedded in a first dielectric layer. A second dielectric layer is formed on the first metal gate electrode, the second metal gate electrode, and the first dielectric layer. An opening is formed in the second dielectric layer that extends in a vertical direction to expose a section of the first metal gate electrode. The section of the first metal gate electrode is removed, while the second metal gate electrode is masked by the second dielectric layer, to define a gate cut at a location of the opening. The gate cut may be subsequently filled by dielectric material.

20 Claims, 9 Drawing Sheets

GATE CUTS AFTER METAL GATE FORMATION

BACKGROUND

The present invention relates to semiconductor device fabrication and integrated circuits and, more specifically, to structures involving a field-effect transistor and methods for forming a structure that involves a field-effect transistor.

Device structures for a field-effect transistor include a source, a drain, a channel situated between the source and drain, and a gate structure including a gate electrode and a gate dielectric separating the gate electrode from the channel. A gate voltage applied to the gate electrode is used to provide switching that selectively connects the source and drain to each other through the channel. The channel of a planar field-effect transistor is located beneath the top surface of a substrate on which the gate structure is supported.

A fin-type field-effect transistor (FinFET) is a non-planar device structure that may be more densely packed in an integrated circuit than planar field-effect transistors. A FinFET may include a fin consisting of a body of semiconductor material, heavily-doped source/drain regions formed in sections of the body, and a gate electrode that wraps about a channel located in the fin body between the source/drain regions. The arrangement between the gate structure and fin improves control over the channel and reduces the leakage current when the FinFET is in its' off state. This, in turn, enables the use of lower threshold voltages, and results in improved performance and lower power consumption.

A gate electrode is usually formed initially as a line-type structure that extends across multiple spaced-apart active regions and isolation regions included in the substrate between these spaced-apart active regions. A gate electrode is patterned so as to have a desired critical dimension, i.e., the dimension of gate electrode corresponding to a "gate length" (or direction of current travel) of the finished field-effect transistor. The initially-patterned gate electrode may be cut by performing an etching process to define gate electrodes having a desired length in a "gate-width" direction of the transistor device. This results in rectangular-shaped gate electrodes, when viewed from above, having the desired dimensions in the gate-length and gate-width directions.

The gate cut may be performed after the interlayer dielectric fill is performed and the gate electrode is revealed by polishing for removal to form the gate cut. Critical gate cuts are dimensionally small in in comparison with non-critical gate cuts. As fin pitch scales downward, providing a critical gate cut at locations between fins presents challenges with respect to process margin. Conventional gate cut patterning and etching process, which merely rely upon a masked etching process, may cause damage to the fins and to the interlayer dielectric layer, especially for critical gate cuts of small critical dimension.

Improved structures involving a field-effect transistor and methods for forming a structure that involves a field-effect transistor are needed.

SUMMARY

In an embodiment of the invention, a method includes forming a first metal gate electrode and a second metal gate electrode that are embedded in a first dielectric layer, and forming a second dielectric layer on the first metal gate electrode, the second metal gate electrode, and the first dielectric layer. An opening is formed in the second dielectric layer that extends in a vertical direction to expose a section of the first metal gate electrode. The section of the first metal gate electrode is removed, while the second metal gate electrode is masked by the second dielectric layer, to define a gate cut at a location of the opening. The gate cut may be subsequently filled by dielectric material.

In an embodiment of the invention, a structure includes a gate electrode having a top surface and a sidewall that extends in a vertical direction to the top surface. A first spacer is located adjacent to the sidewall of the gate electrode. The first spacer is aligned in the vertical direction with the sidewall of the gate electrode and terminates at the top surface of the gate electrode. The structure further includes a dielectric layer positioned in a gate cut. The dielectric layer has a sidewall that projects in a vertical direction. A second spacer is adjacent to the sidewall of the dielectric layer. The second spacer terminates below the top surface of the gate electrode.

In an embodiment of the invention, a structure includes a gate stack with a metal gate conformal layer and a metal gate fill layer on the metal gate conformal layer, and a dielectric layer positioned in a gate cut extending in a vertical direction through the gate stack. The dielectric layer has a sidewall that projects in a vertical direction through the gate stack. The metal gate conformal layer terminates at the sidewall of the dielectric layer, and the dielectric layer has a top surface that is coplanar with a top surface of the metal gate fill layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
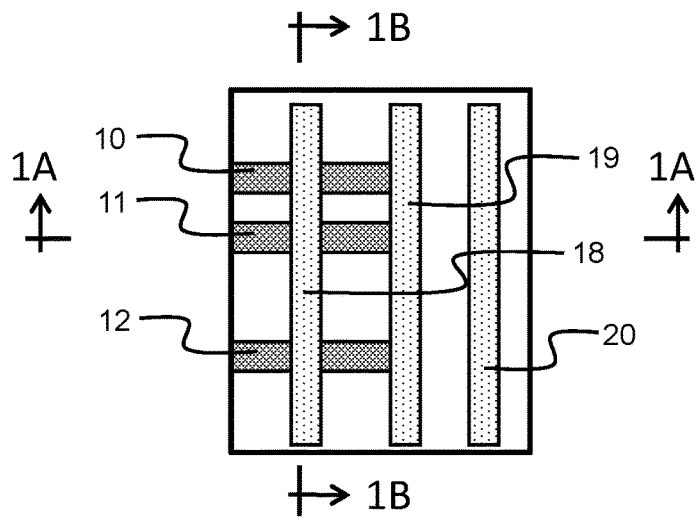
FIG. 1 is a schematic top view showing an arrangement of fins and gate electrodes in a device structure at an initial fabrication stage of a processing method in accordance with embodiments of the invention.
Figure 1A:
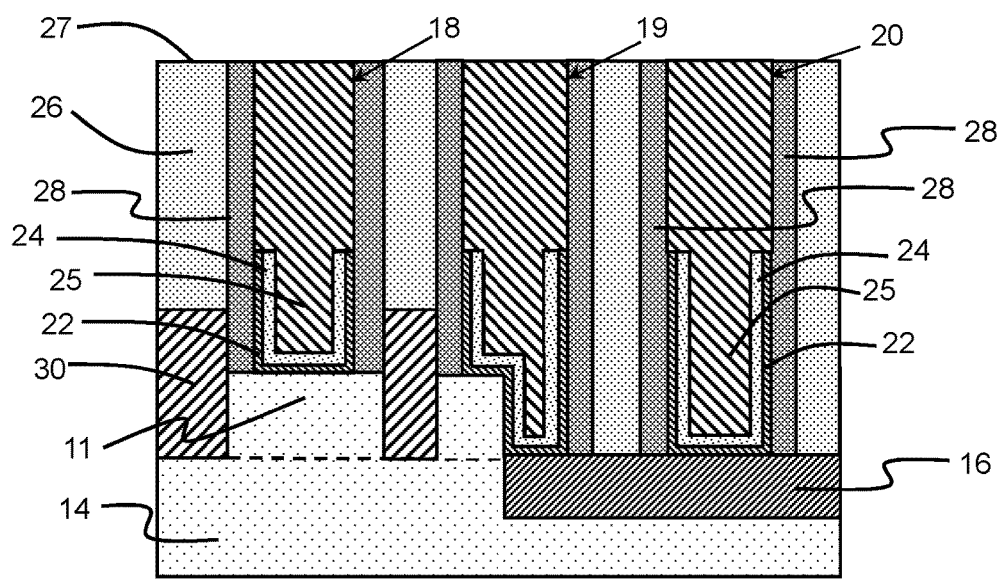
FIG. 1A is a cross-sectional view taken generally along line 1A-1A in FIG. 1.
Figure 1B:
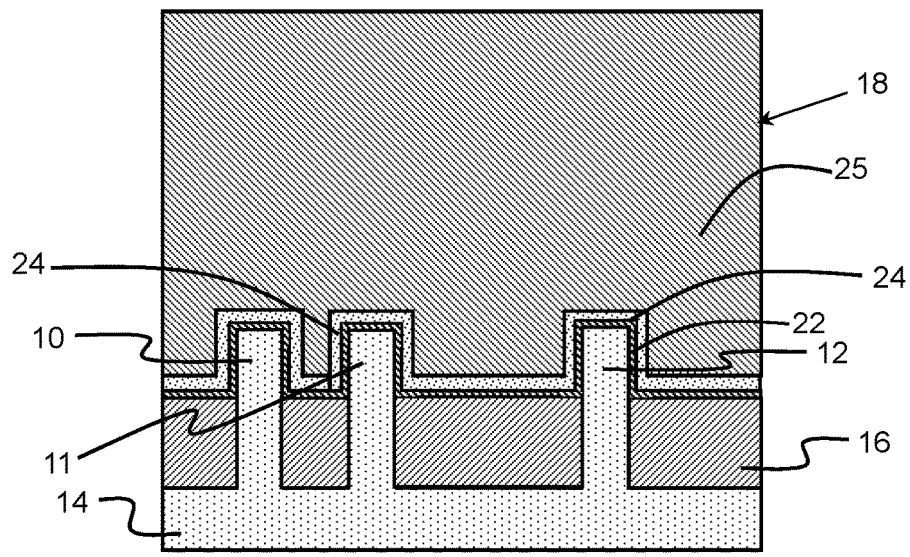
FIG. 1B is a cross-sectional view taken generally along line 1B-1B in FIG. 1.

With reference to FIGS. 1, 1A, 1B and in accordance with embodiments of the invention, fins 10, 11,12 are formed on a substrate 14 and shallow trench isolation (STI) 16 is formed that provides electrical isolation for the fins 10, 11, 12 and other adjacent fins (not shown). The fins 10, 11, 12 are three-dimensional bodies comprised of a semiconductor material, such as undoped or intrinsic silicon, arranged in lengthwise parallel rows and project in a vertical direction relative to the top surface of the substrate 14. The fins 10, 11, 12 may be formed by photolithography and etching processes, such as a sidewall imaging transfer (SIT) process or self-aligned double patterning (SADP). The substrate 14 may be a bulk substrate composed of silicon or a silicon device layer of a semiconductor-on-insulator (SOI) substrate. The STI 16 may be composed of, for example, silicon dioxide ($SiO_2$) deposited by chemical vapor deposition (CVD).

A gate dielectric layer 22 is conformally deposited on the fins 10, 11, 12 and the STI 16. The gate dielectric layer 22 may be composed of a dielectric material, such as a high-k dielectric having a dielectric constant (e.g., permittivity) higher than the dielectric constant of $SiO_2$. In particular, candidate high-k dielectric materials for the gate dielectric layer 22 may have a dielectric constant (i.e., permittivity) greater than 10 and, in an embodiment, a dielectric constant in a range of 10 to 100. Candidate high-k dielectric materials for the gate dielectric layer 22 include, but are not limited to, a hafnium-based dielectric material like hafnium oxide ($HfO_2$), a layered stack of a hafnium-based dielectric material and another other dielectric material (e.g., aluminum oxide ($Al_2O_3$)), or combinations of these and other dielectric materials.

Gate electrodes 18, 19, 20 are arranged in lengthwise parallel rows and are aligned orthogonal or transverse to the fins 10, 11, 12. The gate electrodes 18 and 19 overlap with the fins 10, 11, 12 and are separated from their exterior surfaces by the gate dielectric layer 22. The gate electrodes 18, 19, 20 and fins 10, 11, 12 may be used to form one or more fin-type field-effect transistors. Each of the gate electrodes 18, 19, 20 includes a gate stack that includes, in addition to the gate dielectric layer 22, a metal gate conformal layer 24 representing one or more barrier metal layers and/or work function metal layers, such as titanium aluminum carbide (TiAlC) or titanium nitride (TiN), and a metal gate fill layer 25 that is comprised of a conductor, such as tungsten (W). The layers 24, 25 may be serially deposited by atomic layer deposition (ALD) or CVD on the fins 10, 11, 12 and the STI 16. The metal gate conformal layer 24 is conformally deposited with a constant thickness that is independent of the underlying feature topography, and the metal gate fill layer 25 is deposited as a blanket or fill material. In an embodiment, the metal gate conformal layer 24 and the gate dielectric layer 22 may be recessed before the metal gate fill layer 25 is deposited.

The gate electrode 18, 19, 20 are surrounded by spacers 28, which may be composed of a dielectric material such as silicon oxycarbonitride (SiOCN) or silicon oxycarbide (SiOC). A semiconductor layer 30 is formed by epitaxial growth on sections of the fins 10, 11, 12 that are not covered by the spacer-clad gate electrodes 18, 19, 20. The semiconductor layer 30 may include portions that are located in the interstitial spaces between the spacer-clad gate electrodes 18, 19, 20. The semiconductor layer 30 grows epitaxially from the sidewalls of the fins 10, 11, 12 in order to merge source/drain regions and provide a larger area for landing vertical contacts to the source/drain regions. The semiconductor layer 30 may be comprised of a semiconductor material, such as silicon germanium (SiGe) or silicon (Si), and may be in situ doped during growth to impart a given conductivity type to the semiconductor material.

The gate electrodes 18, 19, 20 are embedded in, and the fins 10, 11, 12 and STI 16 are covered by, an interlayer dielectric layer 26. The interlayer dielectric layer 26 may be composed of a dielectric material, such as silicon dioxide ($SiO_2$), that is deposited by CVD. The gate electrodes 18, 19, 20 are coplanar with a top surface 27 of the interlayer dielectric layer 26. The materials constituting the spacers 28 and the gate electrodes 18, 19, 20 are capable of being removed selective to the dielectric material constituting the interlayer dielectric layer 26. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 2A:
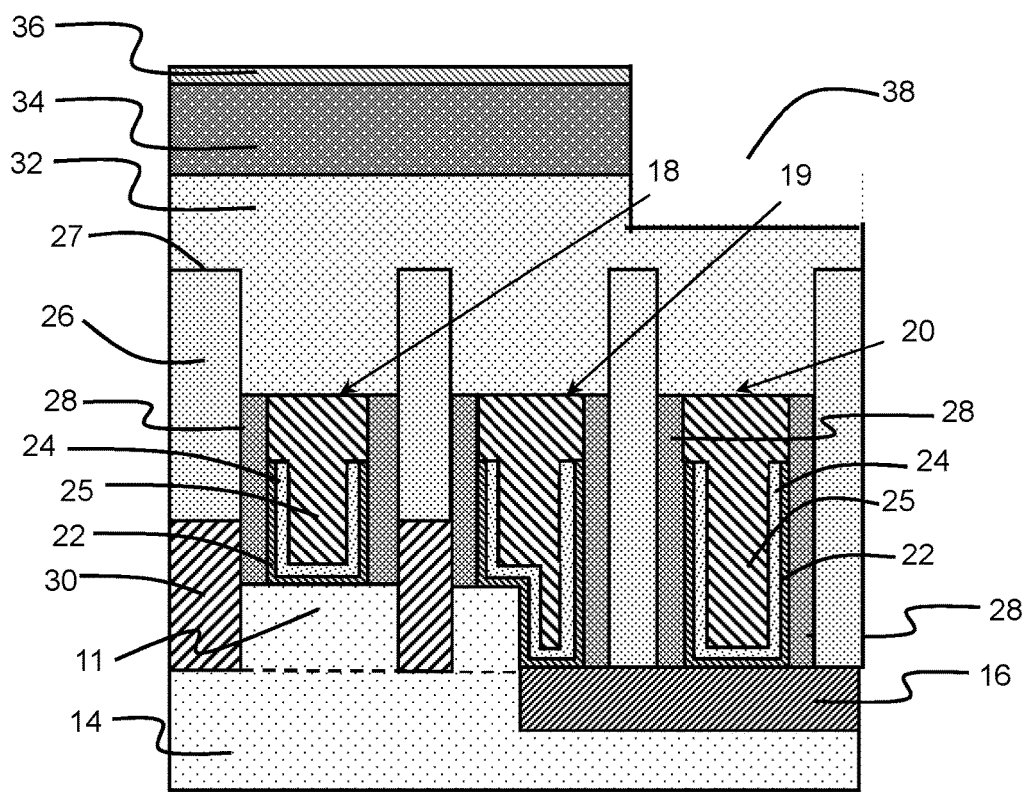
FIGS. 2A and 2B are respective cross-sectional views of the device structure at a fabrication stage of the processing method subsequent to FIGS. 1A and 1B.
Figure 2B:
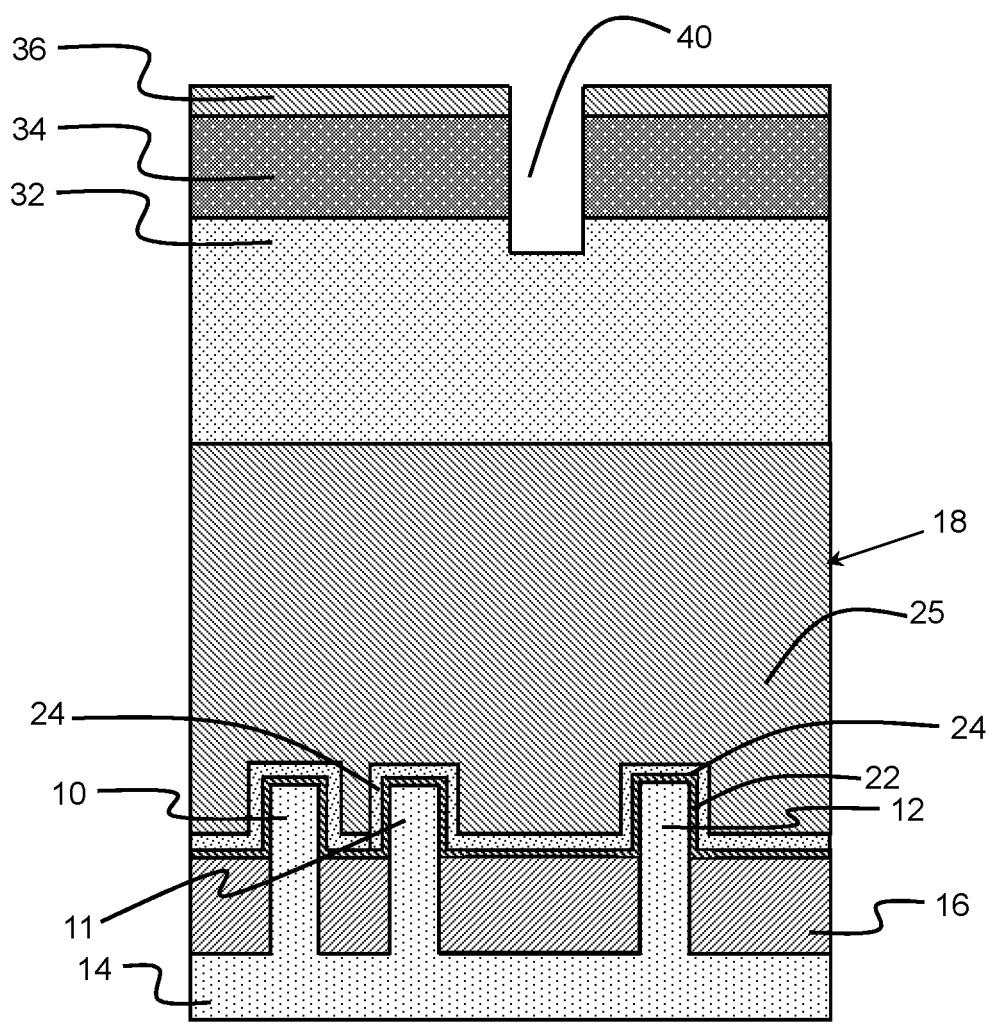

With reference to FIGS. 2A, 2B in which like reference numerals refer to like features in FIGS. 1A, 1B and at a subsequent fabrication stage, the metal gate fill layer 25 of the gate electrodes 18, 19, 20 and the spacers 28 are recessed relative to the top surface 27 of the interlayer dielectric layer 26 with an etching process. The etching process may remove the conductor of the metal gate fill layer 25 selective to the dielectric material of the interlayer dielectric layer 26. The etching process recessing the metal gate fill layer 25 may be an isotropic etching process. The spacers 28 are also recessed with an etching process that removes the spacers 28 selective to the dielectric material of the interlayer dielectric layer 26.

A conformal dielectric layer 32 is deposited that fills the spaces created by the recessing of the metal gate fill layer 25 and the spacers 28, and that covers the top surface 27 of the interlayer dielectric layer 26. The dielectric layer 32 may be comprised of, for example, silicon nitride ($Si_3N_4$) deposited by ALD, which results in a planar top surface for the dielectric layer 32 without the necessity of polishing. An organic planarization layer 34 may be applied by spin-coating an OPL material on a top surface of the dielectric layer 32. A hardmask layer 36 is formed on a top surface of the organic planarization layer 34. The hardmask layer 36 is composed of a material, such as silicon dioxide ($SiO_2$), a silicon-containing anti-reflective coating (SiARC), titanium oxide ($TiO_x$), or silicon oxynitride (SiON) deposited by CVD or physical vapor deposition (PVD).

The hardmask layer 36 is patterned and then used to pattern the organic planarization layer 34 to define gate cuts 38, 40. The gate cut 38 is aligned in a vertical direction with a section of the gate electrode 20 and, in an embodiment, the gate cut 38 may be aligned with the entirety of the gate electrode 20. The gate cut 40 is located horizontally between fin 11 and fin 12, and is aligned in a vertical direction with a section of the gate electrode 18. The patterning that opens the hardmask layer 36 and organic planarization layer 34 at the location of the gate cuts 38, 40 may rely on etching processes, such as reactive ion etching (RIE), using one or more etch chemistries, and that stops on the dielectric material of the dielectric layer 32 when penetrating vertically through the organic planarization layer 34.

Figure 3A:
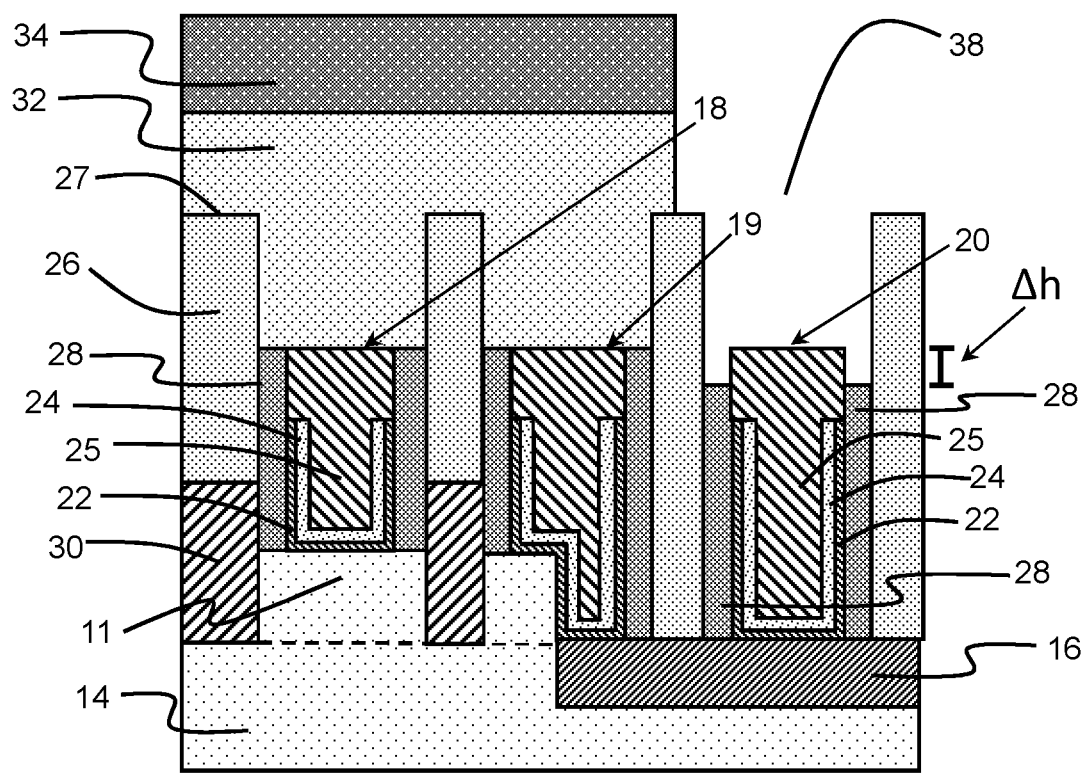
FIGS. 3A and 3B are respective cross-sectional views of the device structure at a fabrication stage of the processing method subsequent to FIGS. 2A and 2B.
Figure 3B:
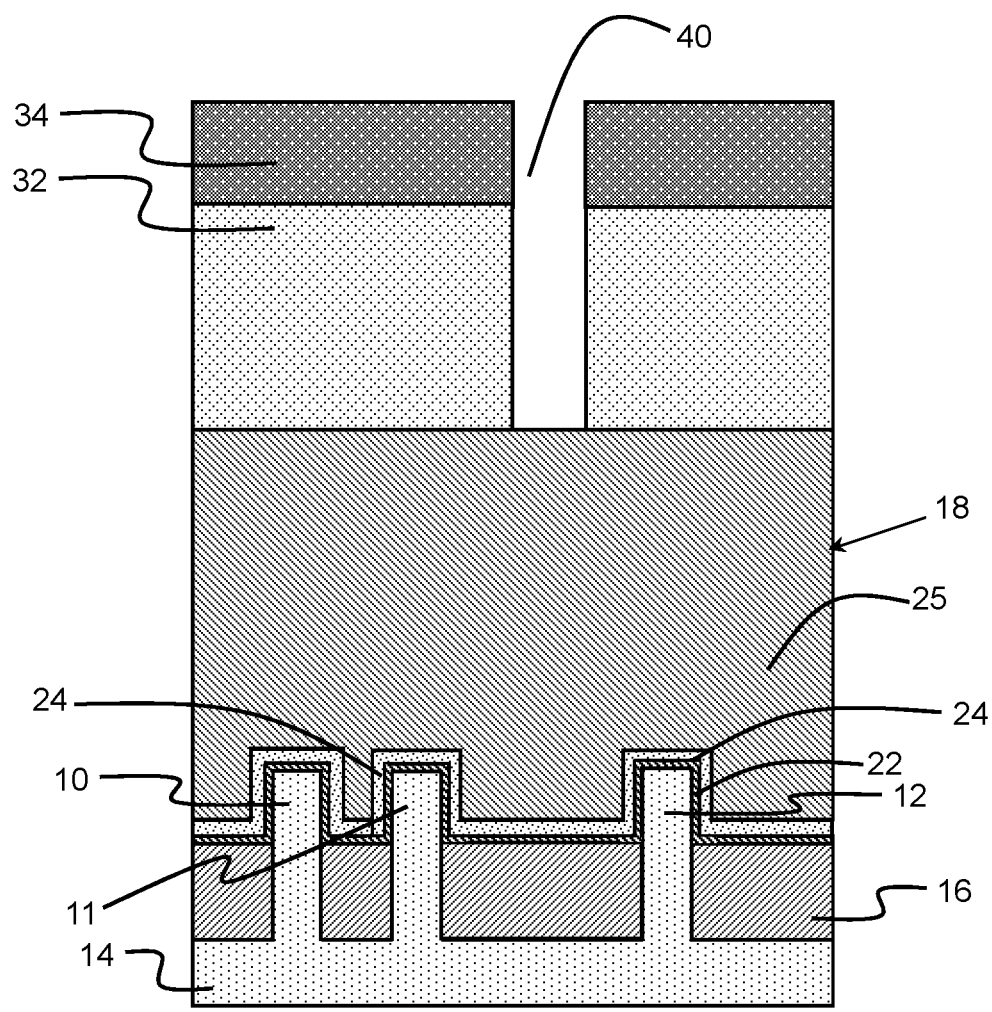

With reference to FIGS. 3A, 3B in which like reference numerals refer to like features in FIGS. 2A, 2B and at a subsequent fabrication stage, the hardmask layer 36 is removed selective to the materials of the organic planarization layer 34 and the dielectric layer 32. For example, if the hardmask layer 36 is comprised of silicon dioxide, a wet chemical etch using a buffered hydrofluoric acid solution may be used to remove the hardmask layer 36. Using the patterned organic planarization layer 34 as an etch mask, the gate cuts 38, 40 are transferred by an etching process to the dielectric layer 32 that removes the material of the dielectric layer 32 selective to the material of the metal gate fill layer 25. The gate cuts 38, 40 extend to the top surface of the metal gate fill layer 25.

The spacers 28 exposed by the gate cut 38 are pulled down slightly relative to the gate electrode 20 and, more specifically, relative to the top surface 21 of the metal gate fill layer 25 of gate electrode 20 by the performance of this etching process. Consequently, the spacers 28 over the area of the gate cut 38 will include a height reduction, Δh, relative to the height of the spacers 28 that are masked by the organic planarization layer 34 across areas not coinciding with the gate cut 38. Due to masking by the organic planarization layer 34 and the dielectric layer 32 during the performance of this etching process, the spacers 28 cladding the gate electrodes 18 and 19, as well as the spacers 28 cladding the gate electrode 20 outside of the area of the gate cut 38, will not be shortened by the etching process. The spacers 28 in these masked areas do not experience the height reduction and will therefore have a height that is greater the height of the spacers 28 over the area of the gate cut 38 due to the height reduction. The reduced height may result from recessing due to an over-etch used to ensure that the material of the dielectric layer 32 is completely removed from the gate electrode 20 inside the perimeter of the gate cut 38.

Figure 4A:
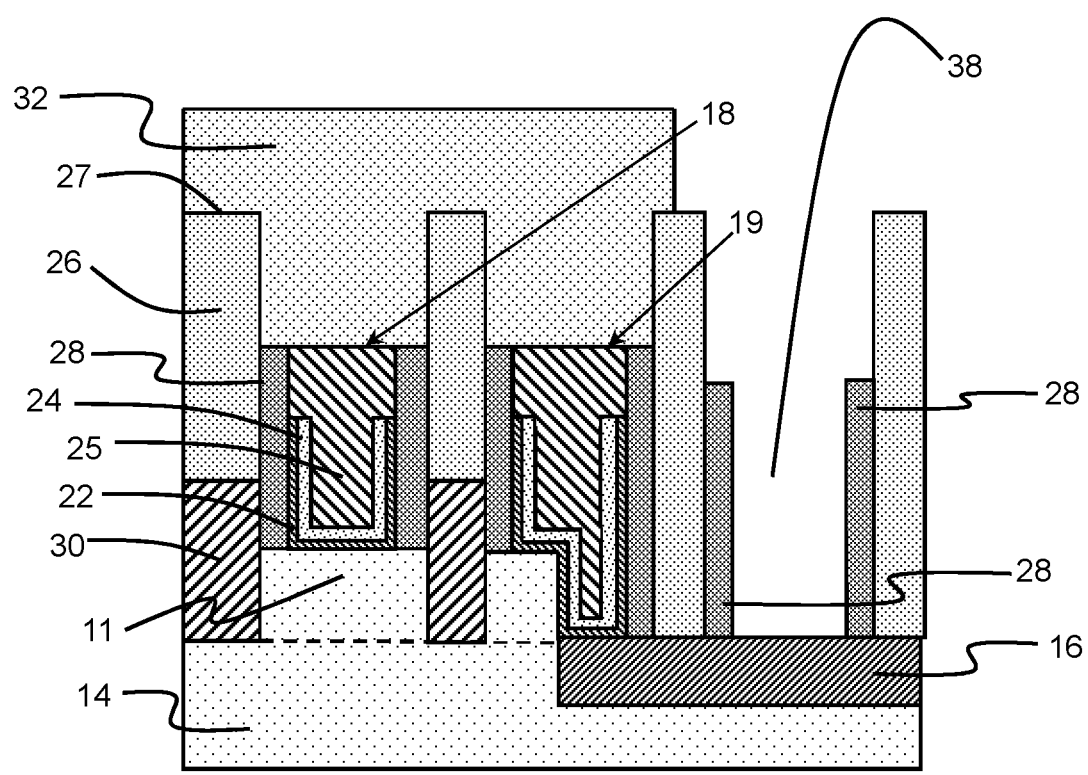
FIGS. 4A and 4B are respective cross-sectional views of the device structure at a fabrication stage of the processing method subsequent to FIGS. 3A and 3B.
Figure 4B:
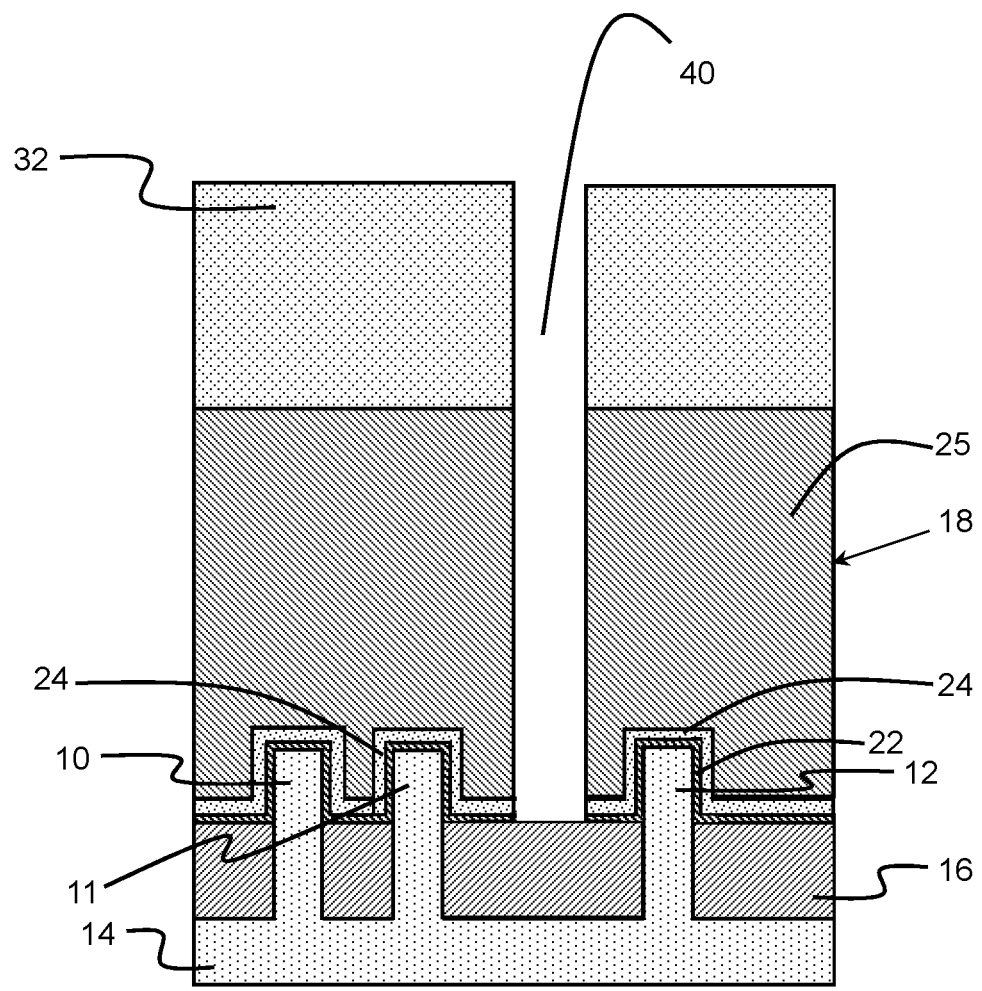

With reference to FIGS. 4A, 4B in which like reference numerals refer to like features in FIGS. 3A, 3B and at a subsequent fabrication stage, a section of the gate electrode 18 exposed by the gate cut 40 is removed at the location of the gate cut 40. More specifically, the metal gate conformal layer 24 and metal gate fill layer 25 constituting the section of the gate electrode 18 are removed at the location of the gate cut 40. A section of the gate electrode 20 is removed at the location of the gate cut 38. More specifically, the metal gate conformal layer 24 and metal gate fill layer 25 constituting the section of the gate electrode 20 are removed at the location of the gate cut 38. In an embodiment, the gate electrode 20 may be removed in its entirety.

The materials of the metal gate conformal layer 24 and metal gate fill layer 25 are removed at the location of the gate cuts 38, 40 selective to the materials of the interlayer dielectric layer 26 and the spacers 28. For example, one or more directional etching processes, such as reactive ion etching (RIE), each having a given etch chemistry may be used to remove respective sections of the gate electrodes 18 and 20 at the location of the gate cuts 38, 40.

Sections of the gate dielectric layer 22 are revealed by the removal of the sections of the metal gate conformal layer 24. The gate dielectric layer 22 may optionally be removed over the area of the gate cuts 38, 40 by an etching process, such as reactive ion etching (RIE), having a given etch chemistry that removes the material of the gate dielectric layer 22 selective to the materials of the interlayer dielectric layer 26 and spacers 28.

The removal of the gate electrodes 18 and 20 and the optional removal of the gate dielectric layer 22 over the areas of gate cuts 38, 40 creates unfilled open spaces that extend in a vertical direction through the interlayer dielectric layer 26 and between the spacers 28 to the top surface of the STI 16 or the gate dielectric layer 22 on the STI 16 if the gate dielectric layer 22 is not removed. Gate electrode 18 is divided by the gate cut 40 into two separate gate electrodes 18a, 18b each comprised of the metal gate conformal layer 24 and metal gate fill layer 25. The gate cut 40 is located in a horizontal direction between the gate electrode 18a and the gate electrode 18b, and defines a vertical discontinuity in the metal gate conformal layer 24 and metal gate fill layer 25.

Figure 5:
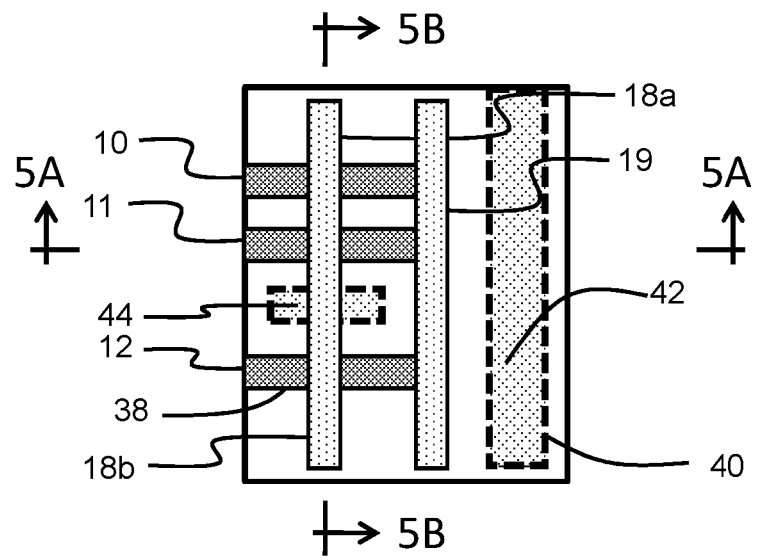
FIG. 5 is a schematic top view at a fabrication stage of the processing method subsequent to FIGS. 4A and 4B in which the fins, gate electrodes, and gate cuts are visible.
Figure 5A:
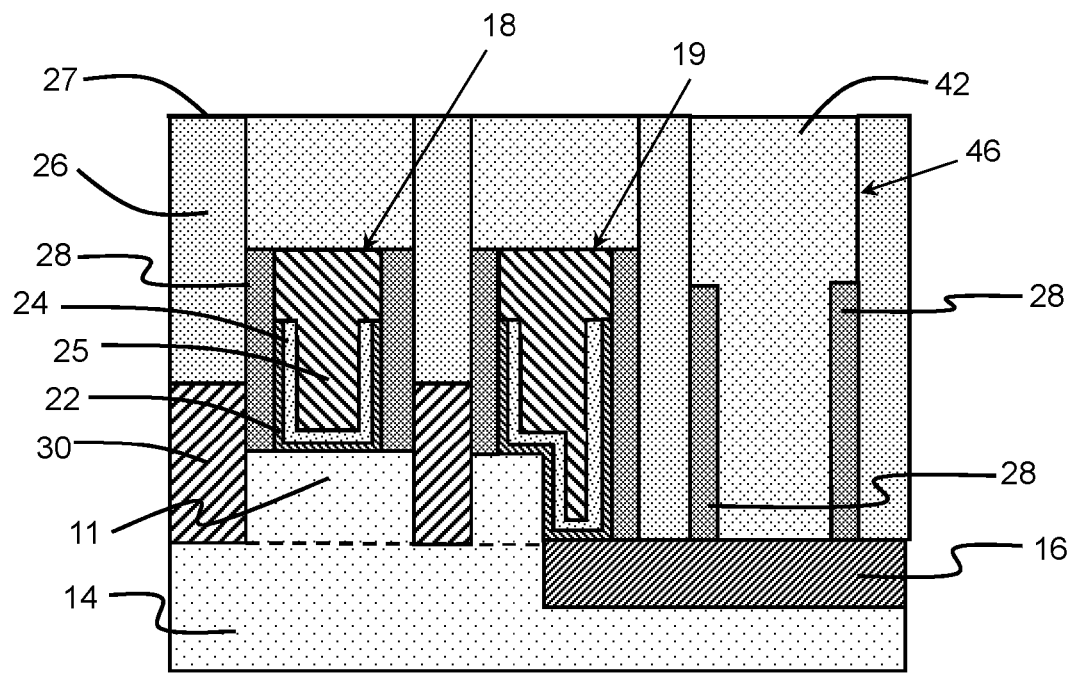
FIG. 5A is a cross-sectional view taken generally along line 5A-5A in FIG. 5.
Figure 5B:
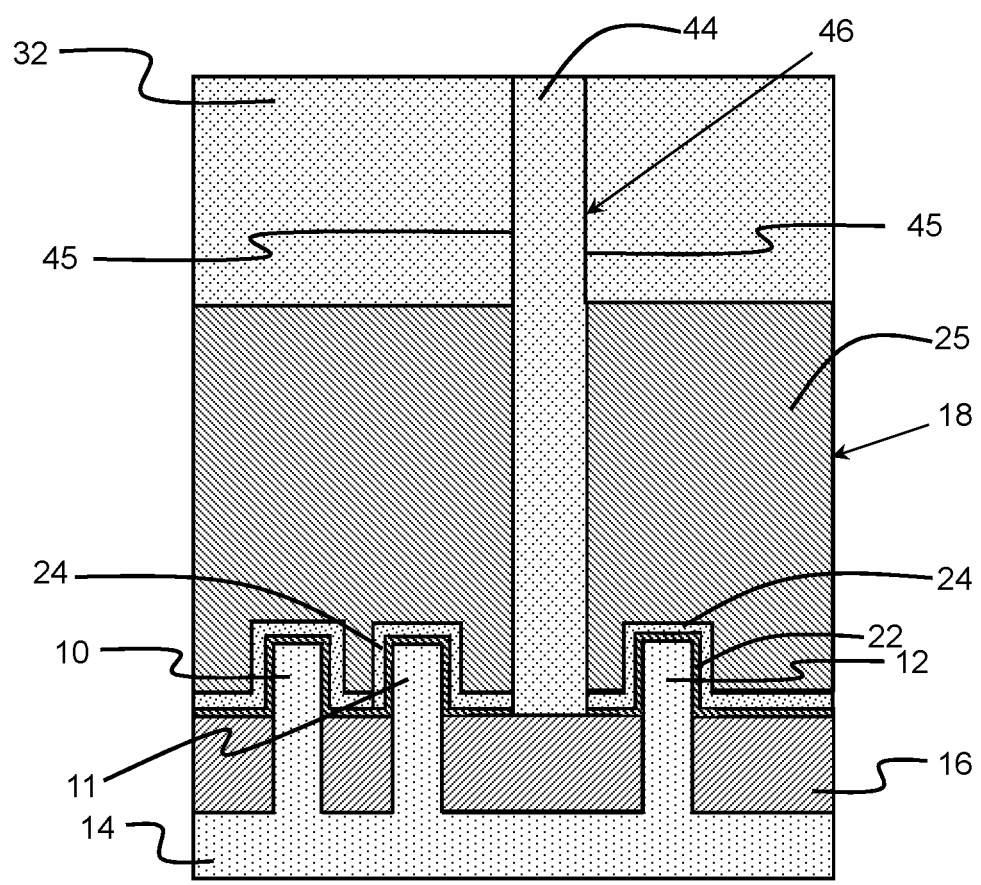
FIG. 5B is a cross-sectional view taken generally along line 5B-5B in FIG. 5.

With reference to FIGS. 5, 5A, 5B in which like reference numerals refer to like features in FIGS. 4A, 4B and at a subsequent fabrication stage, the gate cuts 38, 40 are filled with respective portions 42, 44 of a dielectric layer 46 composed of a dielectric material. In an embodiment, the dielectric layer 46 and the dielectric layer 32 may be composed of the same dielectric material, such as silicon nitride ($Si_3N_4$). A planarization with, for example, chemical mechanical polishing (CMP) may restore a planar top surface 27 for the dielectric layers 26, 32, 46.

The portion 44 of the dielectric layer 46 filling the gate cut 40 includes sidewalls 45 that extend vertically through the dielectric layer 32 and the gate electrode 18. The metal gate conformal layer 24 of gate electrode 18a and the gate dielectric layer 22 terminate at one of the sidewalls 45 of the portion 44 of the dielectric layer 46 on the STI 16 and adjacent to the fin 11. The metal gate conformal layer 24 of gate electrode 18b and the gate dielectric layer 22 terminate at the opposite sidewall 45 of the portion 44 of the dielectric layer 46 on the STI 16 and adjacent to the fin 12. The sidewalls 45 are in direct contact with the dielectric layer 32 and in direct contact with the metal gate fill layer 25 of the gate electrode 18 over the height of the gate cut 40 above the level of the metal gate conformal layer 24.

Silicidation, middle-of-line (MOL), and back-end-of-line (BEOL) processing follow, which includes formation of contacts and wiring for the local interconnect structure overlying the device structure, and formation of dielectric layers, via plugs, and wiring for an interconnect structure coupled by the interconnect wiring with the gate electrodes and source/drain regions of the field effect transistors.

The recessing of the spacers 28 over the area of the gate cut 38, when the dielectric layer 32 is opened, will exhibit the height reduction, Δh, relative to the height of the spacers 28 that are masked by the dielectric layer 32 over areas not coinciding with the gate cut 38. The portion 44 of the dielectric layer 46, because the gate cut 40 is formed and filled with dielectric material after the gate electrode 20 is removed, does not include material from the metal gate conformal layer 24 or the gate dielectric layer 22 extending vertically along its sidewalls. Conventionally, a metal gate layer is deposited after the dielectric material is formed in a gate cut and covers the sidewalls of the dielectric material in the gate cut.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a first metal gate electrode and a second metal gate electrode that are embedded in a first dielectric layer;
   forming a second dielectric layer on the first metal gate electrode, the second metal gate electrode, and the first dielectric layer;
   forming an opening in the second dielectric layer that extends in a vertical direction to expose a section of the first metal gate electrode;
   removing the section of the first metal gate electrode while the second metal gate electrode is masked by the second dielectric layer to define a gate cut at a location of the opening; and
   filling the gate cut with a dielectric material.

2. The method of claim 1 further comprising:
   before the second dielectric layer is formed, recessing the first metal gate electrode and the second metal gate electrode relative to a top surface of the first dielectric layer.

3. The method of claim 2 further comprising:
   planarizing the dielectric material filling the gate cut and the second dielectric layer to be coplanar with the first dielectric layer.

4. The method of claim 2 wherein the second dielectric layer fills spaces formed when the first metal gate electrode and the second metal gate electrode are recessed.

5. The method of claim 2 wherein the first metal gate electrode and the second metal gate electrode are recessed by an isotropic etching process, and the first metal gate electrode is removed using a directional etching process.

6. The method of claim 1 wherein a spacer is located adjacent to the first metal gate electrode, and further comprising:
   before the section of the first metal gate electrode is removed, recessing the spacer relative to a top surface of the first metal gate electrode.

7. The method of claim 6 wherein the spacer is recessed when the opening is formed in the second dielectric layer.

8. The method of claim 1 further comprising:
   planarizing the dielectric material filling the gate cut and the second dielectric layer to be coplanar with the first dielectric layer.

9. The method of claim 1 further comprising:
   before the first metal gate electrode and the second metal gate electrode are formed, forming a first semiconductor fin and a second semiconductor fin,
   wherein the gate cut is located horizontally between the first semiconductor fin and the second semiconductor fin.

10. The method of claim 1 further comprising:
    before the first metal gate electrode and the second metal gate electrode are formed, forming a semiconductor fin,
    wherein the first metal gate electrode includes a metal gate conformal layer that wraps about the semiconductor fin and a metal gate fill layer on the metal gate conformal layer, and the gate cut extends through the metal gate conformal layer and the metal gate fill layer.

11. The method of claim 1 further comprising:
    forming an organic planarization layer on the second dielectric layer,
    wherein the opening extends through the organic planarization layer in the vertical direction.

12. The method of claim 11 further comprising:
    forming a hardmask layer on the organic planarization layer;
    patterning the hardmask layer to form the opening;
    extending the opening through the organic planarization layer; and
    after the opening is extended through the organic planarization layer, removing the hardmask layer.

13. The method of claim 12 wherein the opening is formed in the second dielectric layer after the hardmask layer is removed.

14. The method of claim 12 wherein the hardmask layer is patterned using a patterned photoresist layer.

15. A method comprising:
    forming a first metal gate electrode and a second metal gate electrode that are embedded in a first dielectric layer;
    recessing the first metal gate electrode and the second metal gate electrode relative to a top surface of the first dielectric layer;
    after recessing the first metal gate electrode and the second metal gate electrode, forming a second dielectric layer on the first metal gate electrode, the second metal gate electrode, and the first dielectric layer;
    forming an opening in the second dielectric layer that extends in a vertical direction to expose a section of the first metal gate electrode; and
    removing the section of the first metal gate electrode while the second metal gate electrode is masked by the second dielectric layer to define a gate cut at a location of the opening,
    wherein the second dielectric layer fills spaces formed when the first metal gate electrode and the second metal gate electrode are recessed.

16. The method of claim 15 wherein a spacer is located adjacent to the first metal gate electrode, and further comprising:
    before the section of the first metal gate electrode is removed, recessing the spacer relative to a top surface of the first metal gate electrode.

17. The method of claim 16 wherein the spacer is recessed when the opening is formed in the second dielectric layer.

18. A method comprising:
    forming a first metal gate electrode and a second metal gate electrode that are embedded in a first dielectric layer;

recessing the first metal gate electrode and the second metal gate electrode relative to a top surface of the first dielectric layer;

after recessing the first metal gate electrode and the second metal gate electrode, forming a second dielectric layer on the first metal gate electrode, the second metal gate electrode, and the first dielectric layer;

forming an opening in the second dielectric layer that extends in a vertical direction to expose a section of the first metal gate electrode; and removing the section of the first metal gate electrode while the second metal gate electrode is masked by the second dielectric layer to define a gate cut at a location of the opening, wherein the first metal gate electrode and the second metal gate electrode are recessed by an isotropic etching process, and the first metal gate electrode is removed using a directional etching process.

19. The method of claim 18 wherein a spacer is located adjacent to the first metal gate electrode, and further comprising:

before the section of the first metal gate electrode is removed, recessing the spacer relative to a top surface of the first metal gate electrode.

20. The method of claim 19 wherein the spacer is recessed when the opening is formed in the second dielectric layer.

* * * * *